United States Patent [19]
Howell et al.

[11] Patent Number: 6,027,357
[45] Date of Patent: Feb. 22, 2000

[54] ELECTRICAL CONNECTOR HAVING METAL LATCH

[75] Inventors: David Gregory Howell, Madison, N.C.; Joseph Alexander Labiak, High Point, S.C.; Mark Thomas Downing, Greensboro, N.C.

[73] Assignee: The Whitaker Corporation, Wilmington, Del.

[21] Appl. No.: 08/966,605

[22] Filed: Nov. 10, 1997

Related U.S. Application Data

[60] Provisional application No. 60/033,080, Dec. 13, 1996, and provisional application No. 60/035,091, Jan. 13, 1997.

[51] Int. Cl.⁷ .................................................... H01R 13/62
[52] U.S. Cl. ............................................................. 439/326
[58] Field of Search ..................................... 439/326–328, 439/629–637

[56] References Cited

U.S. PATENT DOCUMENTS

| | | | |
|---|---|---|---|
| 4,986,765 | 1/1991 | Korsunsky et al. | 439/326 |
| 4,995,825 | 2/1991 | Korsunsky et al. | 439/328 |
| 5,100,337 | 3/1992 | Chao | 439/326 |
| 5,123,857 | 6/1992 | Lee Chao | 439/326 |
| 5,169,333 | 12/1992 | Yang Lee | 439/326 |
| 5,174,779 | 12/1992 | Chung | 439/326 |
| 5,286,217 | 2/1994 | Liu et al. | 439/326 |
| 5,484,302 | 1/1996 | Yamada et al. | 439/326 |
| 5,827,085 | 10/1998 | Yodogawa | 439/326 |
| 5,833,478 | 11/1998 | Tseng et al. | 439/326 |

FOREIGN PATENT DOCUMENTS

| | | | |
|---|---|---|---|
| WO 94/29933 | 12/1994 | WIPO | H01R 13/627 |
| WO 95/05693 | 2/1995 | WIPO | H01R 23/70 |
| WO 95/26580 | 9/1995 | WIPO | H01R 13/62 |

*Primary Examiner*—Hien Vu
*Attorney, Agent, or Firm*—Robert J. Kapalka

[57] ABSTRACT

An electrical connector for interconnecting a daughter card to a mother board comprises a dielectric housing having a longitudinally elongated slot and a latch cavity. The housing carries a plurality of contacts which are engageable with contact pads on the daughter card when the daughter card is inserted into the slot in a first position and pivoted through an angle to a second position. A latch member which is attached to the housing has a latch tab engageable behind the daughter card to maintain the daughter card in the second position. The latch member has first and second beams. The first beam has a mounting portion which is stabilized in the latch cavity against longitudinal and lateral movement, and the second beam has a locking tab that is engaged with the housing to secure the latch member against withdrawal from the housing.

10 Claims, 6 Drawing Sheets

ELECTRICAL CONNECTOR HAVING METAL LATCH

This application claims the benefit of U.S. Provisional Applications No. 60/033,080, filed Dec. 13, 1996 and No. 60/035,091 filed Jan. 13, 1997.

FIELD OF THE INVENTION

The invention relates to a card edge electrical connector of the cam-in type having a latch for securing a circuit card in the connector.

BACKGROUND OF THE INVENTION

Cam-in type card edge connectors are known wherein a circuit card is inserted into the connector in a first position with a minimal insertion force, and the circuit card is pivoted to a second position in mating engagement with resilient contacts in the connector. Latches are required to hold the circuit card in the second position against deflection forces exerted by the resilient contacts. These latches may be plastic latches molded integrally with the connector housing, or may be separate components typically made from metal and attached to the connector housing.

U.S. Pat. No. 5,484,302 discloses a cam-in type card edge connector which is arranged to be mounted on a mother board and to hold a daughter card in an orientation which is parallel to the mother board. This connector has discrete metal latches which are held in towers that extend outwardly (parallel to the mother board) from opposite ends of a main housing which holds contacts. The contacts have solder tails which are electrically connected to the mother board by surface mount soldering. The latches have integral solder tabs which are also attached to the mother board by surface mount soldering to increase the retention of the connector to the mother board and to reduce stresses imposed on the solder connections of the contacts. The solder tails of the contacts and the solder tabs of the latches must be coplanar so that good solder joints may be produced, but it is difficult to hold a close coplanarity tolerance on these parts. Also, the metal latches should extend precisely perpendicular to the connector housing for effective latching of the daughter card and for proper alignment with solder pads on the mother board. There is a need for a connector with improved control over positioning of the metal latches. Further, the prior art latch towers take up significant space on the mother board, and there is a need to reduce the size of the housing end portions which receive the metal latches.

SUMMARY OF THE INVENTION

The invention is an electrical connector for interconnecting a daughter card to a mother board. The electrical connector comprises a dielectric housing having a longitudinally elongated slot and a latch cavity. The housing carries a plurality of contacts which are engageable with contact pads on the daughter card when the daughter card is inserted into the slot in a first position and pivoted through an angle to a second position. A latch member which is attached to the housing has a latch tab engageable behind the daughter card to maintain the daughter card in the second position. The latch member has a first beam and a second beam. The first beam has a mounting portion which is stabilized in the latch cavity against longitudinal and lateral movement, and the second beam has a locking tab that is engaged with the housing to secure the latch member against withdrawal from the housing.

BRIEF DESCRIPTION OF THE DRAWINGS

The invention will now be described by way of example with reference to the accompanying drawings wherein.

DETAILED DESCRIPTION OF THE PREFERRED EMBODIMENT

Figure 1:
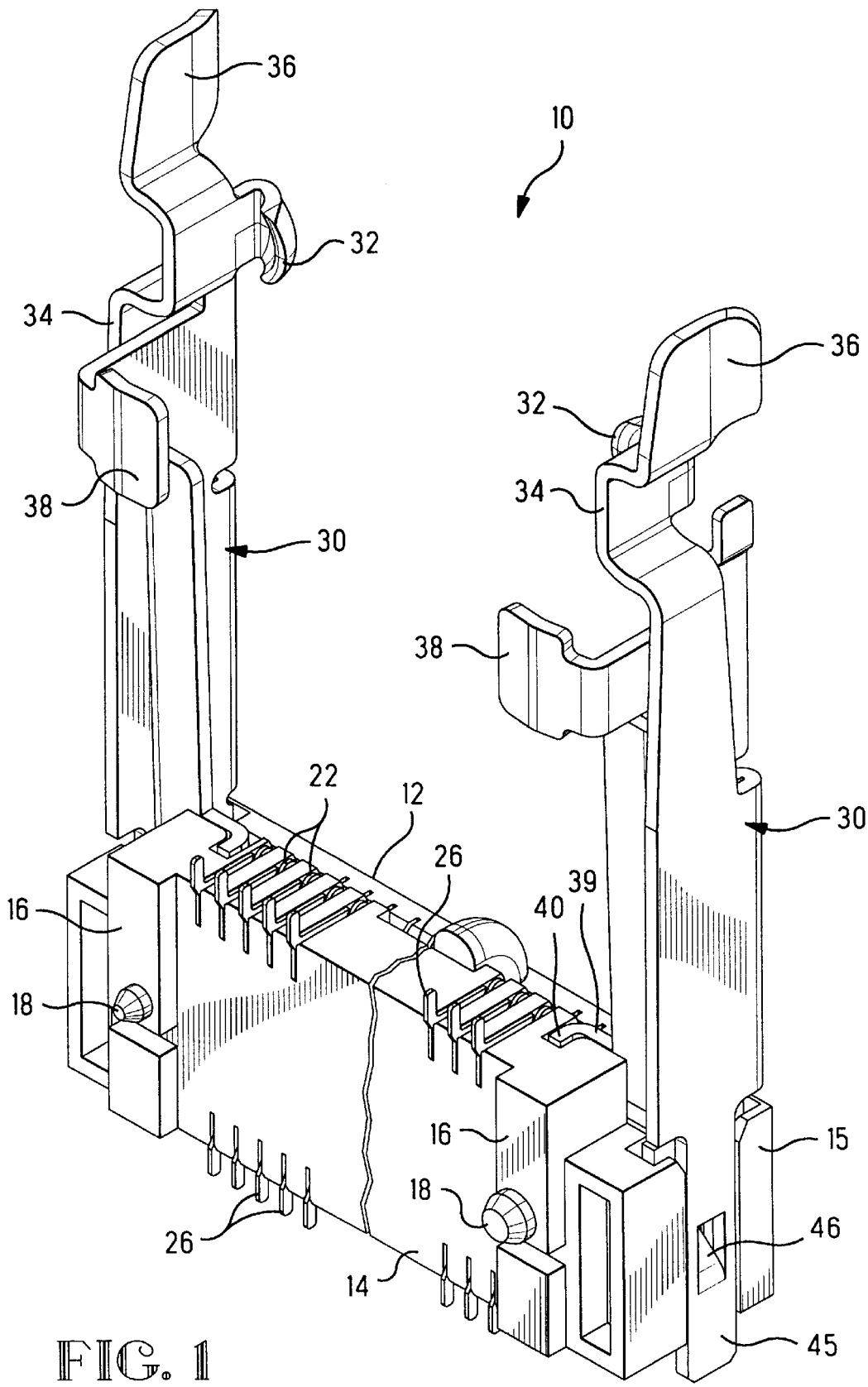
FIG. 1 is an isometric view of an electrical connector according to the invention.
Figure 2:
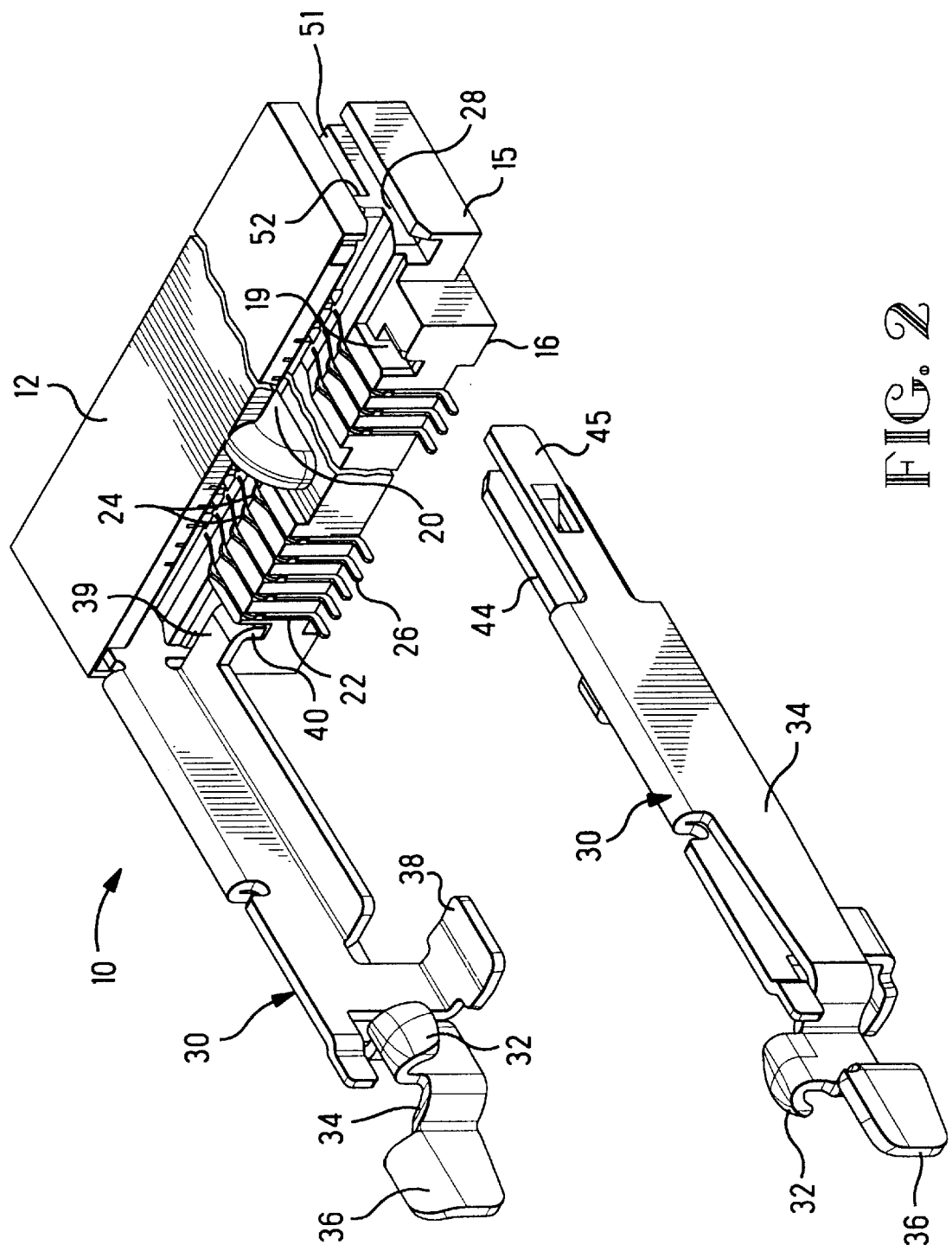
FIG. 2 is an isometric view of the electrical connector in a different orientation with one latch member exploded away.

There is shown in FIGS. 1 and 2 an electrical connector 10 according to the invention for interconnecting a daughter card (not shown) to a mother board (not shown). The connector comprises a dielectric housing 12 having a mounting face 14 which is in confronting relationship with the mother board when the connector housing is mounted thereon. The housing has pedestals 16 which extend from the mounting face 14 to space the mounting face above the mother board, and alignment posts 18 which are receivable in recesses in the mother board to locate the connector on the mother board. The alignment posts 18 may be of different sizes to polarize the connector on the mother board. The housing has an elongated slot 20 which extends longitudinally in the housing and is dimensioned to receive an end portion of the daughter card. The housing carries a plurality of electrical contacts which are held in respective cavities in the housing. Each of the contacts 22 has a resilient contact arm 24 which extends into the slot for engaging a contact pad on the daughter card, and a solder tail 26 which is arranged to be soldered to a contact pad on the mother board.

Figure 3:
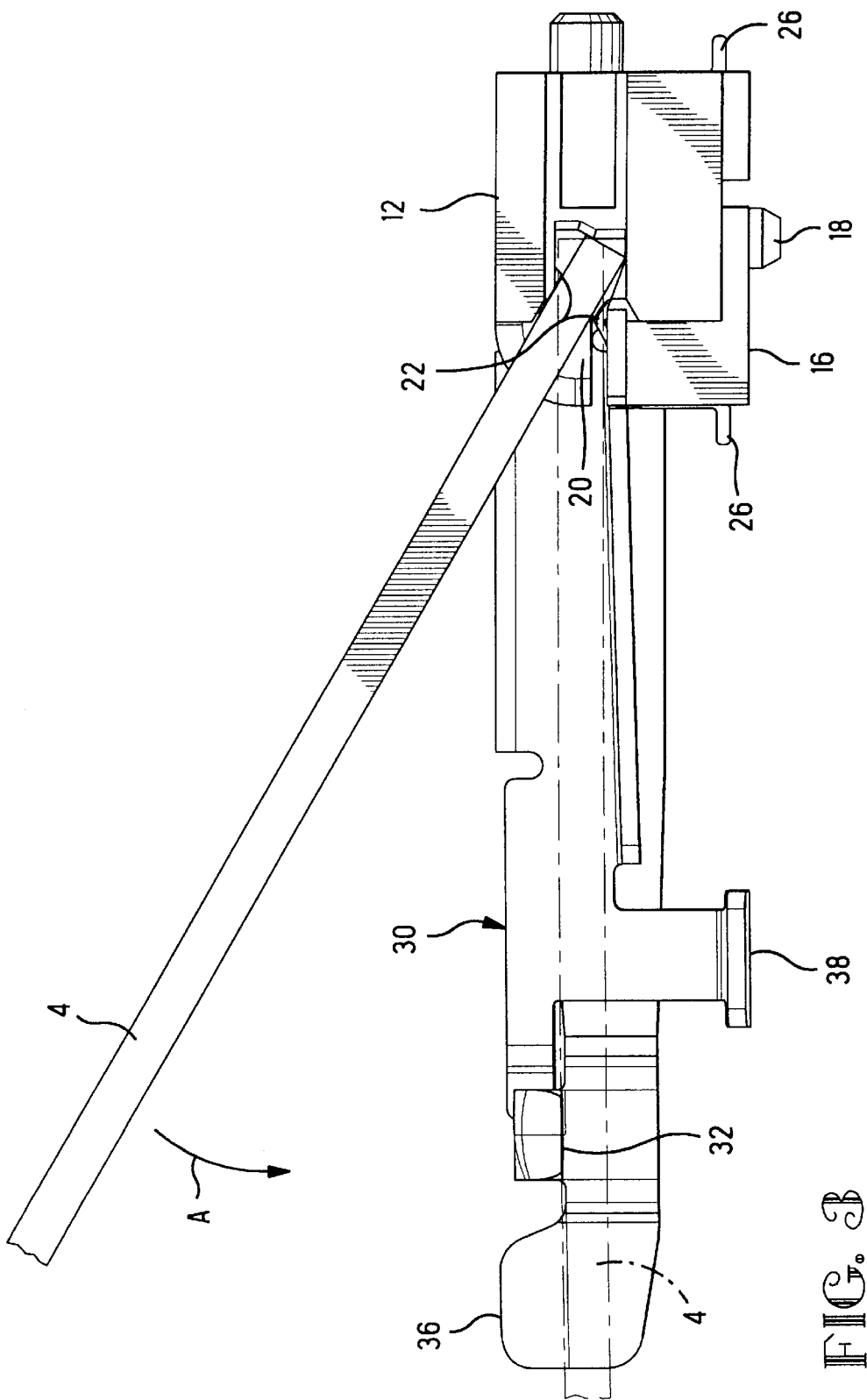
FIG. 3 is an end view of the electrical connector without the one latch member and showing a daughter card being inserted therein.

As depicted in FIG. 3, a daughter card 4 is installed into the connector in a two stage process. A leading end of the daughter card is inserted into the slot 20 when the card is in a first position wherein the leading end of the card slides substantially free of the contacts 20 and encounters only minimal insertion resistance. The card is then pivotable in the direction of arrow A to a second position, shown in phantom, wherein the card is fully inserted and in mating engagement with the contacts. The card resides parallel to the mother board when it is in the second, or mating, position. As the card is pivoted into engagement with the contacts, the card deflects the resilient contact arm of each contact, and this deflection exerts a reaction force on the card which must be counterbalanced by a retention force to hold the card in the mating position. The retention force is supplied by a pair of latch members 30 at opposite ends of the housing, as shown in FIGS. 1–3. Each of the latch members 30 has a latch tab 32 on a latch arm 34 which is resiliently deflected during installation of the daughter card into the slot. After the daughter card passes the latch tab 32, the latch arm 34 resiles and the latch tab engages behind the daughter card to retain the daughter card against the reaction force of the contacts.

Figure 6:
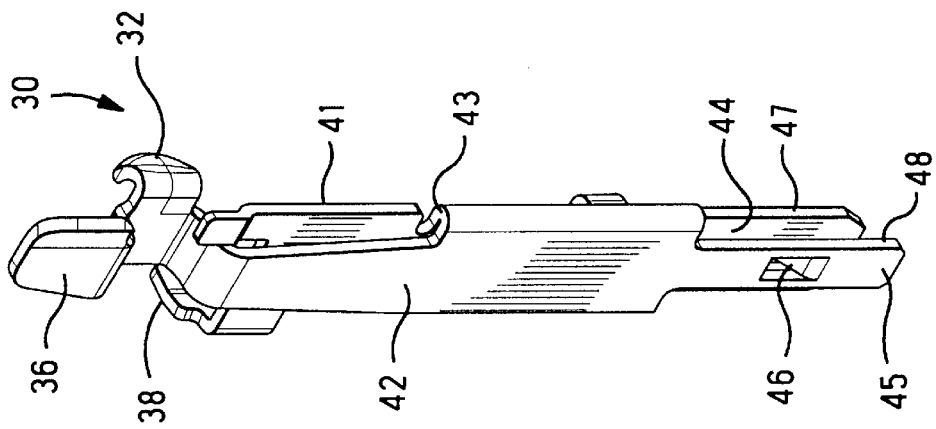
FIGS. 4–6 are different isometric views of a latch member used in the connector.
Figure 5:
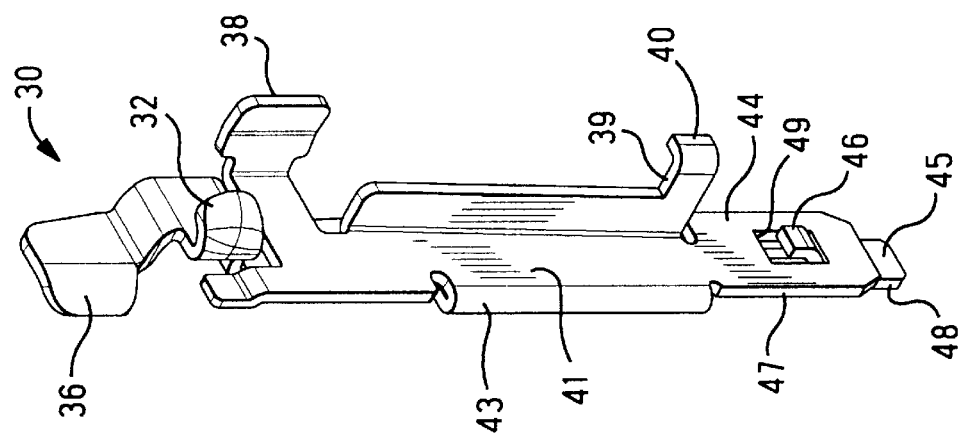
Figure 4:
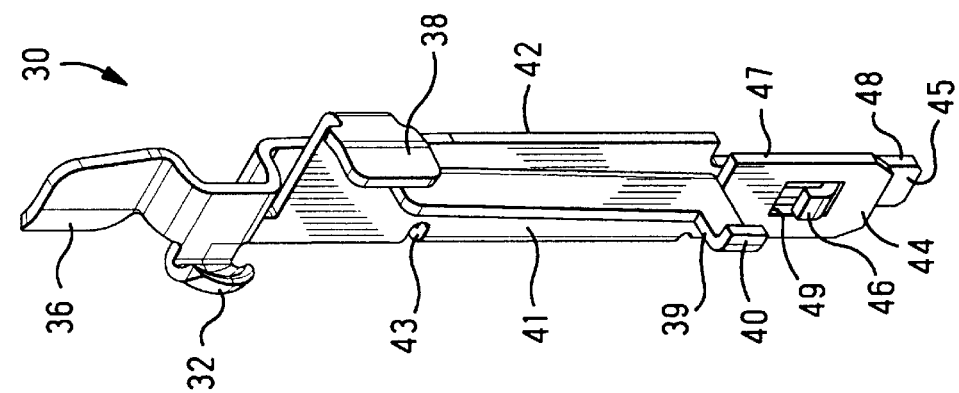

One of the latch members 30 is shown in different views in FIGS. 4–6. The latch member 30 is preferably a monolithic body which is stamped and formed from sheet material. The latch member 30 includes a first, or main beam 41, and a second, or latching beam 42, the beams being connected by a resilient bend portion 43. The main beam 41 has a mounting portion 44 which is stabilized longitudinally and laterally in a latch cavity 28 (FIG. 2) in the housing, and the latching beam 42 has a retention portion 45 which includes a retention means in the form of a locking tab 46 for securing the latch member against vertical withdrawal from the housing. The latch member 30 also has a latch tab 32, a latch release 36, a solder pad 38, and an anti-overstress member 40.

In the embodiment shown, the mounting portion 44 is configured by edge-stamping a section of the sheet material from which the latch member is produced to form a first blade 47. Similarly, the retention portion 45 is an edge-stamped section of the sheet material forming a second blade 48. The first and second blades are disposed face to face in parallel planes. The locking tab 46 is struck from the second blade 48 and extends through a cutout 49 in the first blade 47 to an opposite side of the plane of the first blade.

Figure 7:
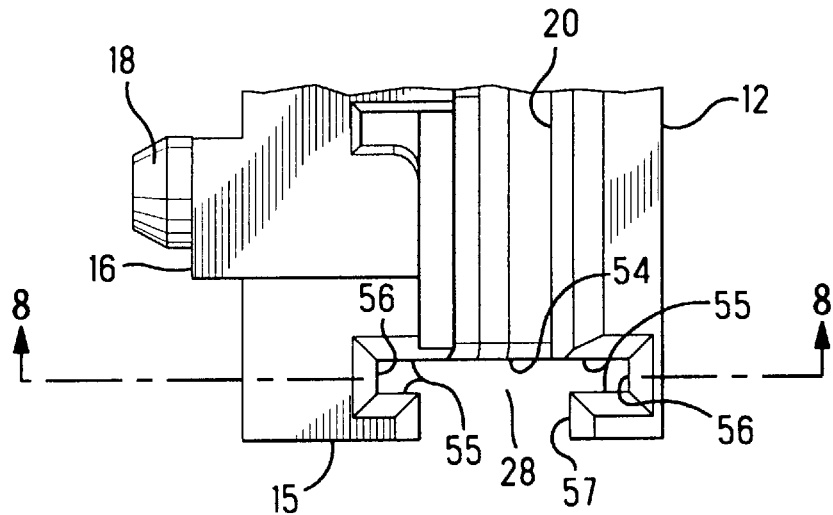
FIG. 7 is an enlarged view of an end portion of the electrical connector housing showing details of a latch cavity for the latch member.
Figure 8:
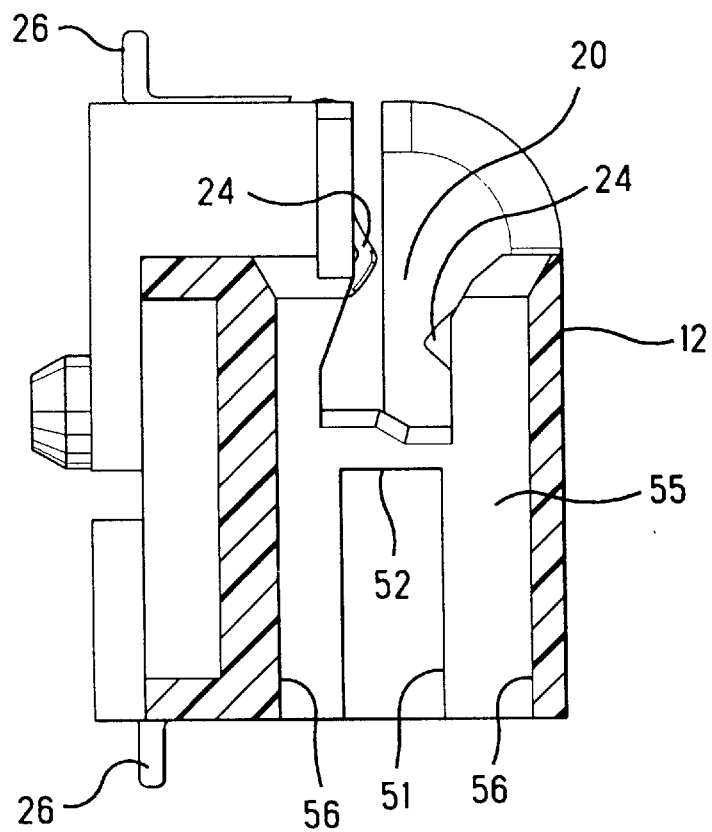
FIG. 8 is a cross-sectional view taken along line 8—8 in FIG. 7.

With further reference to FIGS. 7 and 8, the latch cavity 28 includes a main chamber 54 which is sized to receive the mounting portion 44 of the latch member 30 with zero nominal clearance so that the mounting portion 44 is stabilized both longitudinally and laterally in the housing 12. The main chamber 54 is preferably configured as a rectangular cavity having side walls 55 and end walls 56 which define mutually opposed grooves. The end walls 56 serve to position the first blade 47 laterally with respect to the housing. A distance between the end walls 56 is selected to provide line to line mating or even a slight interference fit with lateral edges of the first blade 47, thus resulting in zero lateral clearance between the first blade and the end walls of the latch cavity. Similarly, the side walls 55 serve to position the first blade 47 longitudinally with respect to the housing, and a distance between the side walls is selected to provide line to line mating with major surfaces of the first blade.

The second blade 48 of the latch member 30 resides in a gap 57 in one of the side walls 55 of the main chamber 54. In order to minimize the overall length of the housing, a dimension of material between the one side wall 55 and an end face 15 of the housing can be made relatively thin. When the latch member 30 is installed in the latch cavity 28, a major surface 50 of the second blade 48 is substantially parallel to the end face 15 of the housing. The locking tab 46 of the second blade 48 protrudes through the cutout 49 in the first blade 47 and into a recess 51 in the opposite side wall 55 of the main chamber 54. The locking tab 46 engages a top surface 52 of the recess 51, thereby securing the latch member 30 against withdrawal from the housing.

The latch member 30 is installed in the housing by inserting the mounting portion 44 linearly into the main chamber 54. During this insertion, the retention portion 45 is deflected outwardly by interference of the locking tab 46 with the side wall 55 above the recess 51. Upon continued insertion of the mounting portion into the main chamber, the locking tab 46 passes the top surface 52 of the recess 51. At this point the retention portion 45 resiles, thereby moving the locking tab 46 into the recess 51 and securing the latch member 30 to the housing. The latch member may be removed from the housing by prying the retention portion 45 outwardly to release the locking tab 46 from beneath the top surface 52 of the recess.

The solder pad 38 of the latch member 30 can be surface mount soldered to the mother board to supplement the retention force provided by the solder tails 26 of the contacts which are also surface mount soldered to the mother board. The solder pad 38 also absorbs bending loads which are imposed on the main beam 41 of the latch member during operation of the resilient latch arm 34. The solder pad 38 is disposed relatively far from the housing 12 and, therefore, any angular misalignment of the latch member in a plane extending perpendicular to the longitudinal dimension of the housing will be translated into a large deviation of the solder pad 38 out of the plane of the solder tails 26. The close fit of the end walls 56 which are nominally in line to line mating with the lateral edges of the first blade 47 helps to ensure that the solder pad 38 is held within a close tolerance of coplanarity to the solder tails 26.

The latch release 36 may be deflected outwardly to withdraw the latch tab 32 from behind the daughter card in order to remove the daughter card from the connector. As the latch release is deflected 36, significant bending loads may be imposed on the length of the latch member which is not supported in the latch cavity. Also, since the one side wall 55 is relatively thin, this side wall may be distorted or cracked by the bending load on the latch member. The anti-overstress member 40 provides additional support for the main beam 41 to resist bending and helps to ensure that the main beam remains perpendicular to the housing. The anti-overstress member 40 is formed as a laterally-extending hook which is connected to the main beam by a plate portion 39. The hook is received behind a wall of a cavity 19 in the housing.

Figure 9:
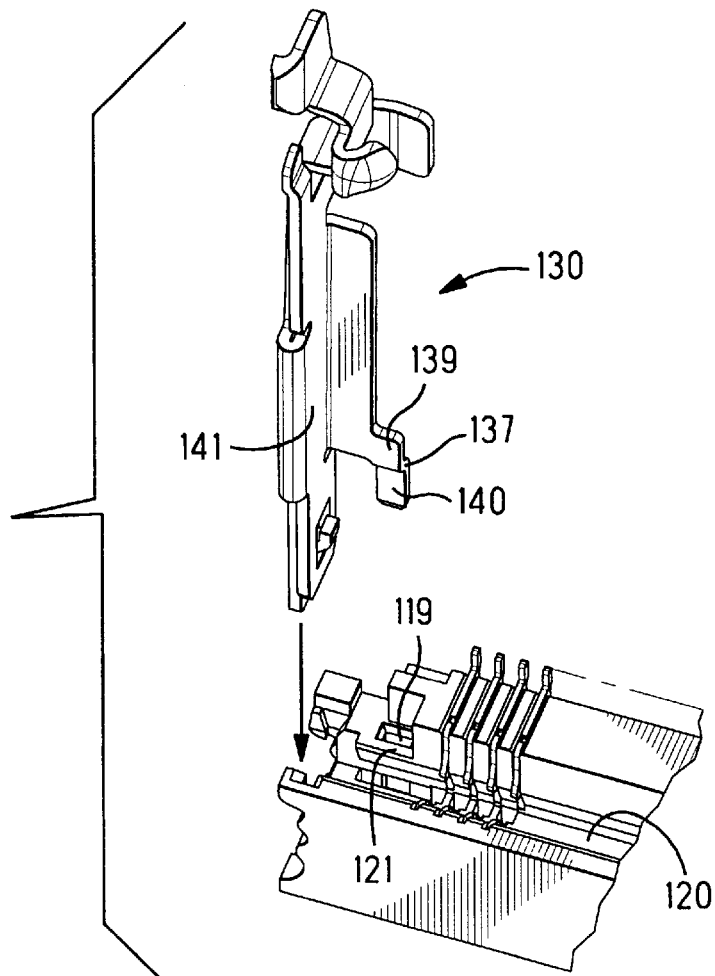
FIG. 9 is an isometric view of an end portion of the electrical connector in an alternate embodiment, with the latch member exploded away.
Figure 10:
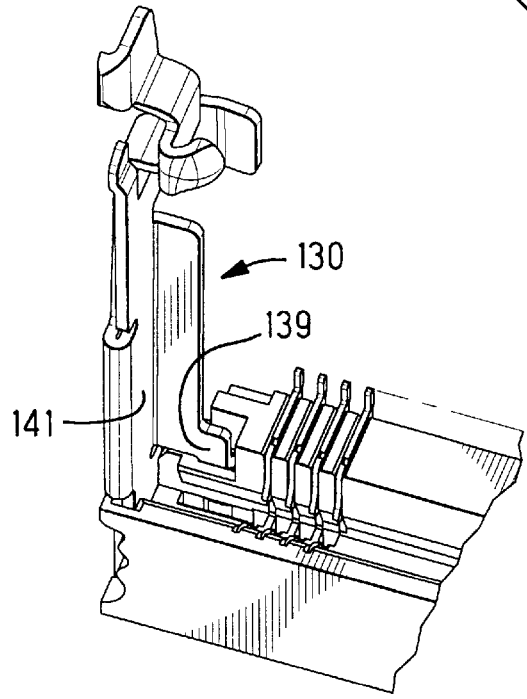
FIG. 10 is an isometric view of the end portion of the connector in FIG. 9 with the latch member installed.

FIGS. 9 and 10 show an end portion of an electrical connector which uses a latch member 130 that is identical to the latch member described above except for the shape of the anti-overstress member. In this embodiment anti-overstress member 140 is formed as a downwardly-extending hook which is received behind a wall of cavity 119 in the connector housing. The anti-overstress member 140, which is connected to main beam 141 by plate portion 139, may be laterally offset from the plate portion 139 by a bend portion 137, thereby allowing the cavity 119 to be separated from slot 120 by a rib 121 of housing material. The rib 121 helps to stabilize the anti-overstress member 140 in the cavity 119.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. An electrical connector for interconnecting a daughter card to a mother board, the electrical connector comprising:

a dielectric housing having a longitudinally elongated slot and a latch cavity;

a plurality of contacts carried by the housing and engageable with contact pads on the daughter card when the daughter card is inserted into the slot in a first position and pivoted through an angle to a second position; and a latch member attached to the housing and having a latch tab engageable behind the daughter card to maintain the daughter card in the second position, the latch member having a first beam and a second beam, the first beam having a mounting portion stabilized in the latch cavity against longitudinal and lateral movement, the second beam having a locking tab engaged with the housing to secure the latch member against withdrawal from the housing, wherein the first beam includes an anti-overstress number, extending substantially perpendicular to the first beam, engageable behind a wall of the housing.

2. The electrical connector according to claim 1, wherein the latch member is a monolithic body.

3. The electrical connector according to claim 1, wherein the mounting portion is configured as a first blade, and the latch cavity includes mutually opposed grooves which receive opposite edge portions of the first blade.

4. The electrical connector according to claim 3, wherein the first blade defines a plane, the second beam is disposed on one side of the plane, and the locking tab extends from the second beam and engages the housing on an opposite side of the plane.

5. The electrical connector according to claim 3, wherein the first blade defines a plane, and the second beam includes a second blade which extends in a different plane parallel to the plane of the first blade.

6. The electrical connector according to claim 5, wherein the locking tab extends from the second blade and engages the housing on an opposite side of the plane of the first blade.

7. The electrical connector according to claim 1, wherein the first and second beams are interconnected by a reverse bend portion.

8. The electrical connector according to claim 1, wherein the first beam includes a solder pad arranged for being soldered to the substrate.

9. An electrical connector for interconnecting a daughter card to a mother board, the electrical connector comprising:

a dielectric housing having a longitudinally elongated slot and a latch cavity;

a plurality of contacts carried by the housing and engageable with contact pads on the daughter card when the daughter card is inserted into the slot in a first position and pivoted through an angle to a second position; and a latch member attached to the housing and having a latch tab engageable behind the daughter card to maintain the daughter card in the second position, the latch member having a first beam and a second beam, the first beam having a mounting portion stabilized in the latch cavity against longitudinal and lateral movement the second beam having a locking tab engaged with the housing to secure the latch member against withdrawal from the housing, wherein the mounting portion is configured as a first blade, and the latch cavity includes mutually opposed grooves which receive opposite edge portions of the first blade, and further wherein the first blade defines a plane, the second beam is diagnosed on one side of the plane, and the locking tab extends from the second beam and engages the housing on an opposite side of the plane, and further wherein the locking tab extends through a cutout in the first blade.

10. An electrical connector for interconnecting a daughter card to a mother board, the electrical connector comprising:

a dielectric housing having a longitudinally elongated slot and a latch cavity;

a plurality of contacts carried by the housing and engageable with contact pads on the daughter card when the daughter card is inserted into the slot in i first position and pivoted through an angle to a second position; and a latch member attached to the housing and having a latch tab engageable behind the daughter card to maintain the daughter card in the second position, the latch member having a first beam and a second beam, the first having a mounting portion stabilizing in the latch cavity against longitudinal and lateral movement, the second beam having a locking tab engaged with the housing to secure the, latch member against withdrawal from the housing, wherein the mounting portion is configured as a first blade, and the lath cavity includes mutually opposed grooves which receive opposite edge portions of the first blade, and further wherein the first blade defines a plane, and the second beam includes a second blade which extends in a different plane parallel to the plane of the first blade, further wherein the locking tab ends from the second blade and engages the housing on an opposite side of the plane of the first blade, and further wherein the locking tab extends through a cutout in the first blade.

* * * * *